(12) United States Patent
Yang et al.

(10) Patent No.: US 8,216,484 B2
(45) Date of Patent: Jul. 10, 2012

(54) METHOD FOR FABRICATING CAPACITOR

(75) Inventors: Jin-Ho Yang, Kyoungki-do (KR); Sang-Do Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 994 days.

(21) Appl. No.: 11/998,895

(22) Filed: Dec. 3, 2007

(65) Prior Publication Data

US 2010/0276388 A1 Nov. 4, 2010

(30) Foreign Application Priority Data

Mar. 19, 2007 (KR) .......................... 10-2007-0026540

(51) Int. Cl.
*C03C 15/00* (2006.01)
(52) U.S. Cl. ............ 216/58; 216/37; 438/689; 438/690; 438/691; 438/692
(58) Field of Classification Search .................... 216/37, 216/58; 438/689–692
See application file for complete search history.

(56) References Cited

U.S. PATENT DOCUMENTS 5,286,668 A * 2/1994 Chou ........................... 438/254
5,753,948 A * 5/1998 Nguyen et al. ................ 257/307
2006/0024883 A1* 2/2006 Hwang ......................... 438/253

FOREIGN PATENT DOCUMENTS

| KR | 1019970063735 A | 9/1997 |
| KR | 1020010036832 A | 5/2001 |
| KR | 1020020096745 A | 12/2002 |
| KR | 1020040059849 A | 7/2004 |

* cited by examiner

*Primary Examiner* — Nadine Norton
*Assistant Examiner* — Maki A Angadi
(74) *Attorney, Agent, or Firm* — Blakely, Sokoloff, Taylor & Zafman

(57) ABSTRACT

A method for fabricating a capacitor includes forming a first storage node (SN) oxide layer over a substrate, forming a second SN oxide layer over the first SN oxide layer, forming a mask pattern over the second SN oxide layer, dry-etching the first and the second SN oxide layers using the mask pattern as an etch barrier to form a capacitor region, and wet-etching a resultant structure including the capacitor region to enlarge a bottom width of the capacitor region, thereby forming a final capacitor region having the enlarged bottom width, wherein the first SN oxide layer comprises one portion of high impurity concentration and the other portion of low impurity concentration, the one portion corresponding to a region where the final capacitor region is to be formed.

14 Claims, 6 Drawing Sheets

METHOD FOR FABRICATING CAPACITOR

CROSS-REFERENCE TO RELATED APPLICATIONS

The present invention claims priority of Korean patent application number 2007-0026540, filed on Mar. 19, 2007, which is incorporated by reference in its entirety.

BACKGROUND OF THE INVENTION

The present invention relates to a method for fabricating a semiconductor device, and more particularly, to a method for fabricating a capacitor.

In recent years, as memory devices are highly integrated, shrink in size and operate at high speed, an occupation area of a capacitor is decreasing in the memory device. Notwithstanding, the capacitor for driving a semiconductor device still requires a capacitance equal to or higher than ever. To secure high capacitance, therefore, there has been announced a method in which a storage node (SN) oxide layer is thickly formed and the SN oxide layer is then dry-etched to increase a height of a capacitor region. However, as the SN oxide layer is thickly formed, a critical dimension (CD) of the bottom of the capacitor region is reduced due to characteristics of the dry etching process itself, thus leading to the deterioration of electrical properties of the device, for instance, the deterioration of capacitance.

To improve the critical dimension of the bottom of the capacitor region, there has been proposed another method in which a bilayered SN oxide layer having thin films with different wet etch rates is employed to increase the critical dimension of the bottom of the capacitor region.

In detail, an interlayer dielectric (ILD) layer is formed over a substrate where a semiconductor circuit including transistors, bit lines, etc., is formed, and thereafter the ILD layer is etched to form a storage node contact hole exposing a portion of a substrate. After a polysilicon layer is deposited on the ILD layer to fill the storage contact hole, the polysilicon layer is planarized through a chemical mechanical polishing (CMP) process until a surface of the ILD layer is exposed, thereby forming a polysilicon plug filling the storage node contact hole. Herein, the polysilicon plug is called a storage node contact plug.

Afterwards, a nitride layer and an SN oxide layer are sequentially formed on the ILD layer including the storage node contact plug. The nitride layer serves as an etch stop layer and the SN oxide layer determines a height of the storage node. The SN oxide layer has a bilayered structure in which two oxide layers having different wet etch rates are stacked over the nitride layer. Hereinafter, a lower layer of the bilayered SN oxide layer is referred to as a first SN oxide layer, and an upper layer of the bilayered SN oxide layer is referred to as a second SN oxide layer. The first SN oxide layer includes a material having a higher wet etch rate than the second SN oxide layer. The first SN oxide layer includes a phospho-silicate glass (PSG) layer or a boro-phospho-silicate glass (BPSG) layer. The second SN oxide layer includes a material having a low wet etch rate such as a plasma enhanced tetra ethyl ortho silicate (PETEOS) layer.

A mask pattern is formed over the second SN oxide layer for defining a capacitor region, and the first and the second SN oxide layers are dry-etched using the mask pattern as an etch barrier to form a capacitor region, which is referred to as a first capacitor region. Since the bilayered SN oxide layer is very high, the width of the first capacitor region gradually decreases toward the bottom. Thereafter, a wet etch process is performed to enlarge the bottom width of the first capacitor region, thereby forming a final capacitor region, i.e., a second capacitor region, with the enlarged bottom width. If the first and the second SN oxide layers having different wet etch rates are wet-etched, the wet etching is performed faster on the first SN oxide layer than the second SN oxide layer because the first SN oxide layer has a higher wet etch rate than the second SN oxide layer. Resultingly, it is possible to enlarge the width of the bottom of the capacitor region.

However, the above-described method has a limitation as follows. The PSG layer or the BPSG layer for the first SN oxide layer is deposited using chemical vapor deposition (CVD), and thus a concentration of the SN oxide layer is determined depending on a concentration of phosphorous (P) or boron (B). Here, a wet etch rate of the PSG layer or the BPSG layer increases as an impurity concentration in the PSG layer or the BPSG layer increases. However, if the PSG or the BPSG is deposited using the CVD, the impurity concentration of the layer is not uniform on the whole, thus causing a high-concentration part of the SN oxide layer to be over-etched during the wet etching process. Accordingly, if the first SN oxide layer is over-etched, a bridge phenomenon may occur between capacitor electrodes in the case where material for a capacitor electrode is deposited onto the capacitor region, leading to the decrease in device reliability and semiconductor yield.

FIG. 1 is a micrographic view of a bridge phenomenon between typical capacitors. Referring to FIG. 1, it can be observed that the bridge occurs between capacitor electrodes after wet etch process, particularly under the capacitor electrode. The reason is that a concentration of a lower layer formed of the PSG layer or the BPSG layer in a bilayered SN oxide layer is not uniform, and thus the high-concentration part is over-etched during the wet etch process.

SUMMARY OF THE INVENTION

Embodiments of the present invention are directed to provide a method for fabricating a capacitor having a bilayered storage node (SN) oxide layer, which is capable of preventing over-etching by adjusting a concentration of a lower layer of the bilayered SN oxide layer to thereby avoid a bridge phenomenon between the capacitors, whereby device reliability and yield are improved.

In accordance with an aspect of the present invention, there is provided a method for fabricating a capacitor. The method includes forming a first storage node (SN) oxide layer over a substrate, forming a second SN oxide layer over the first SN oxide layer, forming a mask pattern over the second SN oxide layer, dry-etching the first and the second SN oxide layers using the mask pattern as an etch barrier to form a capacitor region, and wet-etching a resultant structure including the capacitor region to enlarge a bottom width of the capacitor region, thereby forming a final capacitor region having the enlarged bottom width, wherein the first SN oxide layer comprises one portion of high impurity concentration and the other portion of low impurity concentration, the one portion corresponding to a region where the final capacitor region is to be formed.

DESCRIPTION OF SPECIFIC EMBODIMENTS

Embodiments of the present invention relate to a method for fabricating a capacitor.

Figure 1:
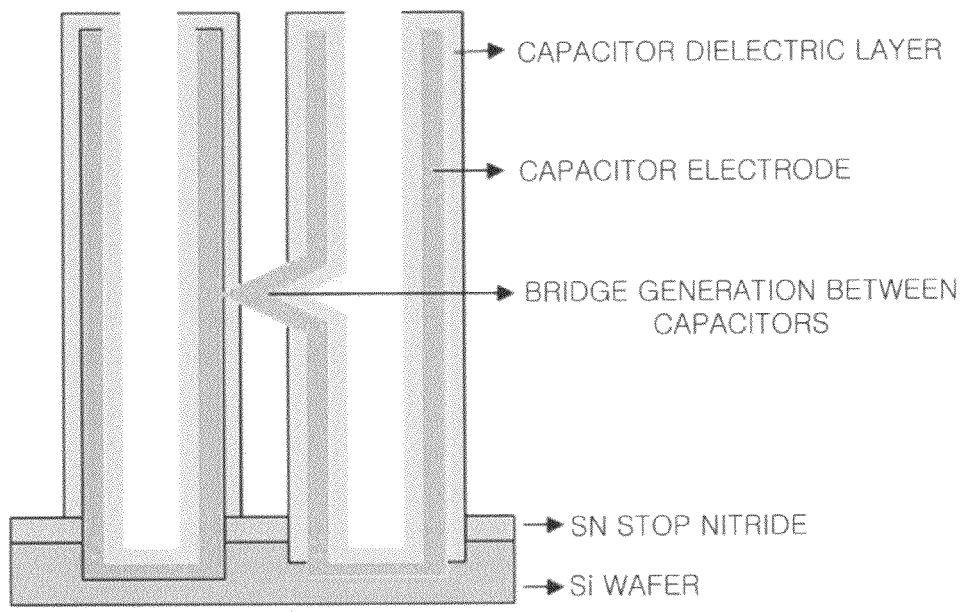
FIG. 1 is a micrographic view of a bridge phenomenon between typical capacitors.
Figure 2A:
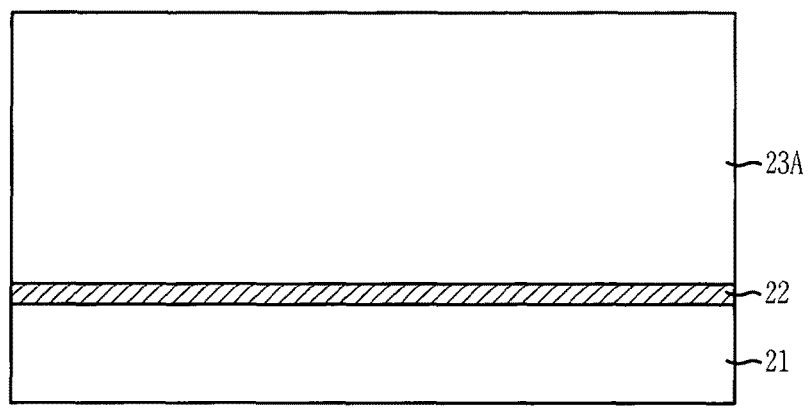
FIGS. 2A to 2G are cross-sectional views of a method for fabricating a capacitor in accordance with an embodiment of the present invention.

FIGS. 2A to 2G are cross-sectional views of a method for fabricating a capacitor in accordance with an embodiment of the present invention. Referring to FIG. 2A, a nitride layer 22 serving as an etch stop layer is formed over a substrate 21 where a predetermined underlying structure is formed. The nitride layer 22 is used to prevent an underlying structure from being etched during a subsequent process of etching a SN oxide layer.

A first SN oxide layer, i.e., a lower layer of a bilayered SN oxide layer, is formed on the nitride layer 22. It is preferable that the first SN oxide layer is formed of a PSG layer or a BPSG layer. In the first SN oxide layer, a portion where a capacitor region 210 will be finally formed through wet-etching of the first SN oxide layer has a high concentration, but the other portions have a low concentration. The first SN oxide layer may be formed to a thickness ranging from approximately 1,000 Å to approximately 8,000 Å. The first SN oxide layer may be formed through processes shown in FIGS. 2A to 2C.

Referring back to FIG. 2A, a low-concentration oxide layer 23 is formed over the nitride layer 22. If the first SN oxide layer includes the PSG layer or the BPSG layer, the low-concentration oxide layer 23 has a low impurity concentration by adjusting a concentration of P or B. The concentration adjustment of P or B may be performed by controlling a flow rate of source gas containing P or B used in depositing PSG layer or BPSG layer. If adjusting the concentration of P or B to 0, it is possible to form an impurity-free oxide layer 23.

Figure 2B:
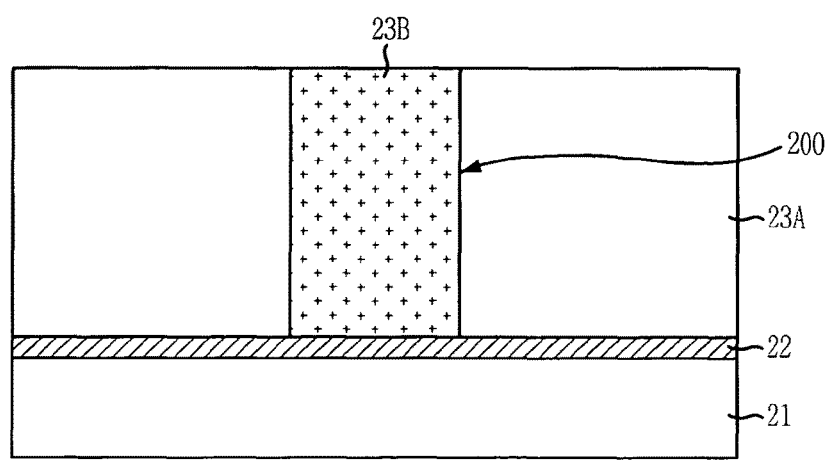

Referring to FIG. 2B, the low-concentration oxide layer 23 is patterned through mask and etch processes to thereby form a hole 200 exposing a region where a capacitor region 210 will be formed through a subsequent dry etch process of the SN oxide layer. Hereinafter, the patterned low-concentration layer will be referred to as a first oxide layer 23A for convenience in description.

A high-concentration oxide layer, of which an impurity concentration is higher than that of the first oxide layer 23A, is formed over a resultant structure having the first oxide layer 23A and the hole 200. Thereafter, a CMP or an etch-back process is performed to planarize the high-concentration oxide layer until the surface of the first oxide layer 23A is exposed, thereby forming a second oxide layer 23B of high concentration that fills the hole 200. The etch-back process is performed using gas chemistry where $Ar/O_2$ is added into a base gas of fluorine. It is preferable that the second oxide layer 23B is formed of the PSG layer or the BPSG layer. In this case, the second oxide layer 23B has high-concentration impurities by adjusting the concentration of P or B higher than that of the first oxide layer 23A. The adjustment of the concentration of P or B may be performed by controlling the flow rate of source gas containing P or B used in depositing the PSG layer or the BPSG layer.

Figure 2C:
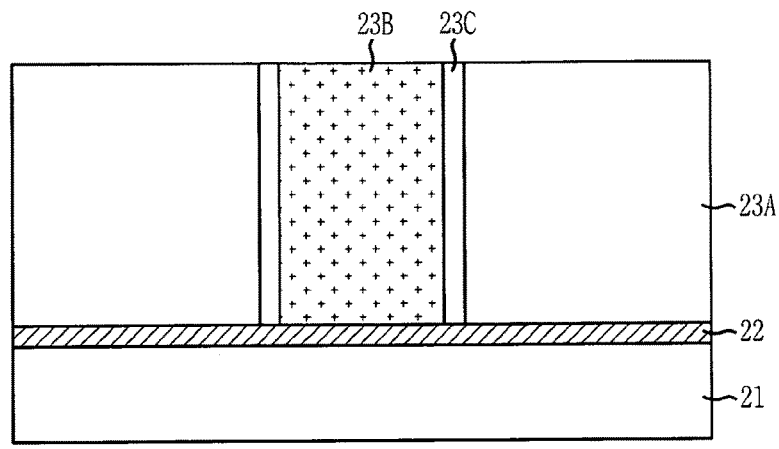

Referring to FIG. 2C, a heat treatment is performed upon a resultant structure where the first and the second oxide layers 23A and 23B are formed over the substrate 21. As described above, since the second oxide layer 23B has a higher concentration than the first oxide layer 23A, impurities, e.g., P or B, diffuse into the first oxide layer 23A from the second oxide layer 23B, thus increasing an impurity concentration of both sidewalls of the first oxide layer 23A disposed adjacent to the second oxide layer 23B. The high-concentration portions of the first oxide layer 23A at both the sidewalls thereof will be referred to as a third oxide layer 23C hereinafter. The heat treatment may be performed using a rapid thermal process (RTP) or an annealing process. It is preferable that the heat treatment is performed at a temperature ranging from approximately 100° C. to approximately 500° C.

Through the above-described processes of FIGS. 2A to 2C, a first SN oxide layer can be formed, which is configured with the first oxide layer 23A of low concentration, the second oxide layer 23B of high concentration, and the third oxide layer 23C of high concentration obtained by impurity diffusion. Although the first, second and third oxide layers 23A, 23B and 23C are formed of the same material such as PSG and BPSG, they have different impurity concentrations so that their wet etch rates differ from one another. That is, the second oxide layer 23B and the third oxide layer 23C have higher concentration than the first oxide layer 23A, and thus they have etch rates higher than the first oxide layer 23A. Even though a subsequent wet-etching process is performed for enlarging a bottom width of the capacitor region 210, it is possible to prevent the over-etch of the first SN oxide layer while securing a CD of the bottom of the capacitor region 210 by virtue of the first oxide layer of low concentration.

Figure 2D:
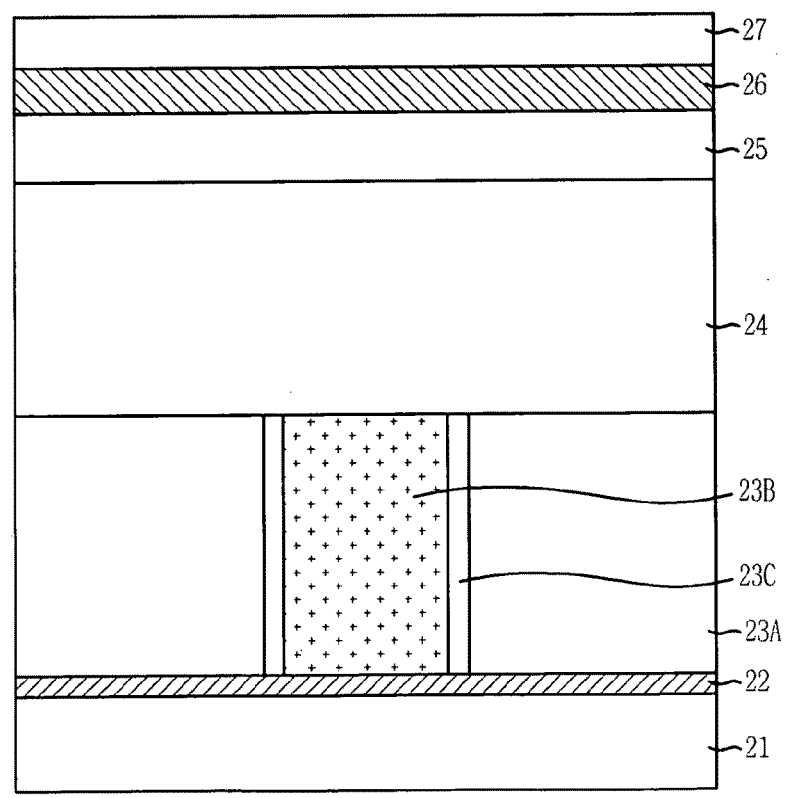

Referring to FIG. 2D, an oxide layer 24 is formed over the first SN oxide layer. The oxide layer 24 has a lower etch rate than the first SN oxide layer. For example, it is preferable that the oxide layer 24 includes PETEOS layer. The oxide layer 24 may be formed to a thickness ranging from approximately 1,000 Å to approximately 8,000 Å. A hard mask layer 25, an anti-reflection layer 26 and a photoresist layer 27 are formed over the oxide layer 24.

Figure 2E:
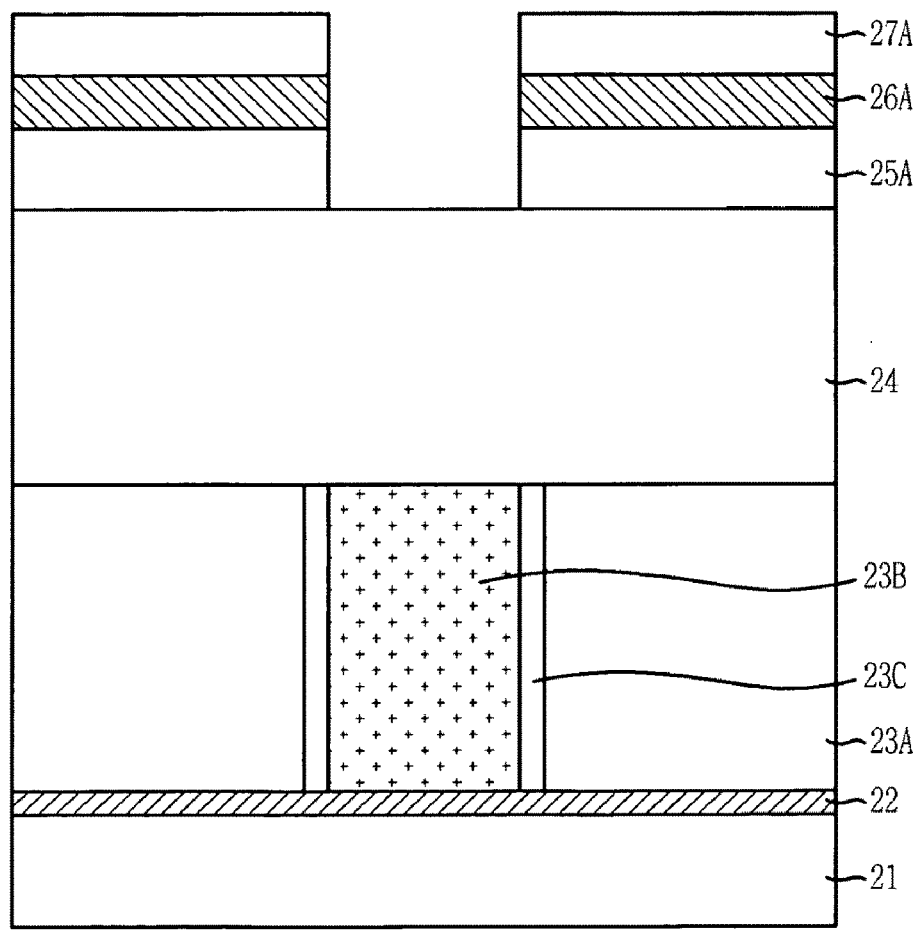

Referring to FIG. 2E, the photoresist layer 27 is patterned through exposure and development processes to form a photoresist pattern 27A defining a region where a capacitor region 210 will be formed. The anti-reflection layer 26 and the hard mask layer 25 are then etched using the photoresist pattern 27 as an etch barrier, thus forming an anti-reflection pattern 26a and a hard mask pattern 25A.

Figure 2F:
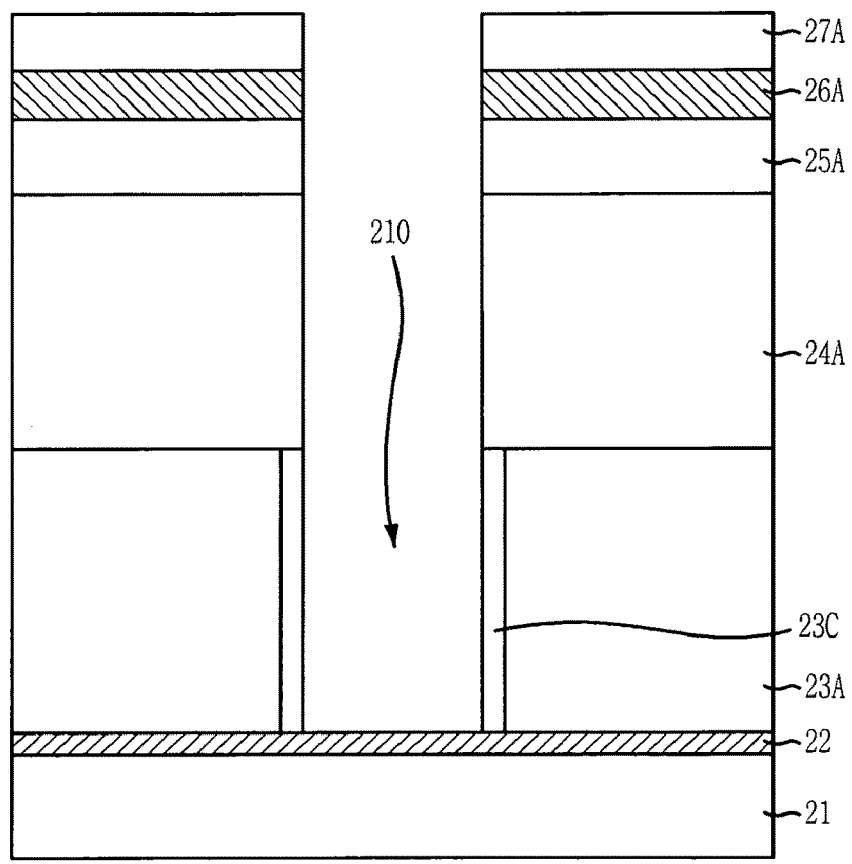

Referring to FIG. 2F, the oxide layer 24 and the first SN oxide layer are dry-etched using the hard mask pattern 25A as an etch barrier to form the capacitor region 210. Hereinafter, the patterned oxide layer will be referred to as a second SN oxide layer 24A in comparison with the first SN oxide layer disposed thereunder. In the case where a total height of the first SN oxide layer and the second SN oxide layer 24A is too great, the width of the capacitor region 210 may be gradually reduced from the top toward the bottom due to characteristics of the dry etching process. Therefore, it should be necessary to additionally perform a wet etch upon the first SN oxide layer so as to enlarge the bottom width of the capacitor region 210.

Figure 2G:
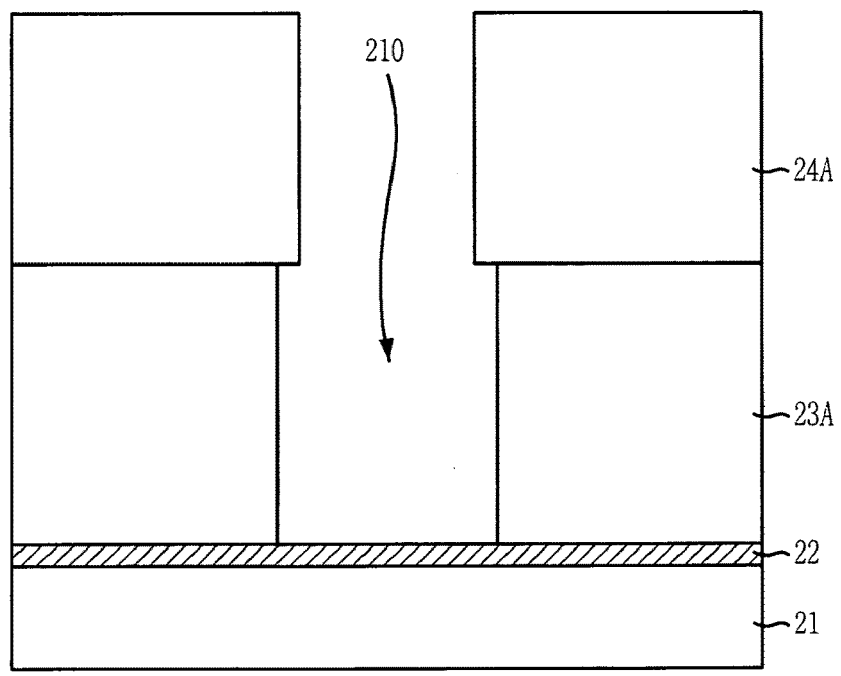

Referring to FIG. 2G, a wet etching is performed on a resultant structure with the capacitor region 210 formed. Because the first SN oxide layer is includes a material having a higher wet etch rate than the second SN oxide layer 24A, for example, formed of the PSG layer or the BPSG layer, the second SN oxide layer 24A is rarely wet-etched but only the first SN oxide layer is wet-etched, which makes it possible to enlarge the bottom width of the capacitor region 210. Further, since the first SN oxide layer includes the first oxide layer 23A of low concentration and the second and the third oxide layers 23B and 23C of high concentration and, the wet etch is dominantly performed on the second and third oxide layers 23B and 23C so that the over-etch of the first SN oxide layer can be prevented. It is preferable that the wet etching is performed for approximately 2 seconds to approximately 60 seconds. Although not shown, a capacitor electrode is formed in the capacitor region 210 of which the bottom width is enlarged.

In the above-described process, it is easier to control to enlarge the bottom width of the capacitor region 210 by constructing the first SN oxide layer to have a low-concentration part and a high-concentration part, thus it is possible to obtain a capacitor with high capacitance through the enlargement of the bottom width of the capacitor region 210. Accordingly, this prevents the lower layer of the SN oxide layer from being over-etched, making it possible to avoid a bridge phenomenon between capacitor electrodes.

In a method for fabricating a capacitor having a bilayered SN oxide layer in accordance with the present invention, it is possible to prevent over-etch of the SN oxide layer by adjusting a concentration of a lower layer of the bilayered SN oxide layer to thereby avoid a bridge phenomenon between the capacitors. This makes it possible to improve device reliability and yield.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a capacitor, the method comprising:
    forming a first storage node (SN) oxide layer over a substrate,;
    forming a second SN oxide layer over the first SN oxide layer;
    forming a mask pattern over the second SN oxide layer;
    dry-etching the first and the second SN oxide layers using the mask pattern as an etch barrier to form a capacitor region; and
    wet-etching a resultant structure including the capacitor region to form a final capacitor region having an enlarged bottom width,
    wherein the first SN oxide layer comprises one portion of having a first impurity concentration and the other portion having a good impurity concentration, one portion corresponding to a region where the final capacitor region is to be formed, and the first impurity concentration is greater than the second impurity concentration,
    wherein the forming of the first SN oxide layer comprises:
    forming a first oxide layer of low concentration over the substrate;
    patterning the first oxide layer through a mask and an etch processes to form a hole in a region where a capacitor region is to be formed:
    filling the hole with a second oxide layer of high concentration: and
    performing a heat on the second oxide layer to diffuse high-concentration impurities of the second oxide layer into the first oxide layer thereby forming the one portion of high impurity concentration at sidewalls of the first oxide layer.

2. The method of claim 1, wherein the substrate comprises a nitride layer forming a top surface thereof, the nitride layer serving as an etch stop layer.

3. The method of claim 1, wherein the first SN oxide layer is formed of a phospho-silicate glass (PSG) layer or a boro-phospho-silicate glass (BPSG) layer.

4. The method of claim 1, wherein the first SN oxide layer is formed to a thickness ranging from approximately 1,000 Å to approximately 8,000 Å.

5. The method of claim 1, wherein the second SN oxide layer is formed of a plasma enhanced tetra ethyl ortho silicate (PETEOS) layer.

6. The method of claim 1, wherein the second SN oxide layer is formed to a thickness ranging from 1,000 Å to approximately 8,000 Å.

7. The method of claim 1, wherein the first SN oxide layer comprised one of a PSG layer and a BPSG layer, and the first oxide layer of said second concentration is formed by decreasing a flow rate of a source gas containing phosphorous (P) or boron (B).

8. The method of claim 1, wherein the first SN oxide layer comprised one of a PSG layer and a BPSG layer, and the first oxide layer said first concentration is formed by decreasing a flow rate of a source gas containing phosphorous (P) or boron (B).

9. The method of claim , wherein filling the hole with a second oxide layer of high concentration comprises:
    forming a second oxide layer over the first oxide layer with the hole formed; and
    planarizing the second oxide layer until a surface of the first oxide layer is exposed.

10. The method of claim 9, wherein planarizing the second oxide layer is performed using a chemical mechanical polishing (CMP) or an etch-back process.

11. The method of claim 10, wherein the etch-back process is performed using a gas mixture where Ar/O2 is added into a base gas of fluorine.

12. The method of claim 1, wherein the heat treatment is performed using a rapid thermal process (RTP) or an annealing process.

13. The method of claim 12, wherein the heat treatment is performed at a temperature ranging from approximately 100 ° C. to approximately 500 ° C.

14. The method of claim 1, wherein the wet-etch of the resultant structure is performed for approximately 2 seconds to approximately 60 seconds.

* * * * *